(12) United States Patent
Hibino (10) Patent No.: US 11,547,032 B2
(45) Date of Patent: Jan. 3, 2023

(54) TRAY-TYPE COMPONENT SUPPLY DEVICE (71) Applicant: FUJI CORPORATION, Chiryu (JP)

(72) Inventor: Shotaro Hibino, Ichinomiya (JP)

(73) Assignee: FUJI CORPORATION, Chiryu (JP)

( * ) Notice: Subject to any disclaimer, the term of this patent is extended or adjusted under 35 U.S.C. 154(b) by 381 days.

(21) Appl. No.: 16/958,910

(22) PCT Filed: Jan. 29, 2018

(86) PCT No.: PCT/JP2018/002639
§ 371 (c)(1),
(2) Date: Jun. 29, 2020

(87) PCT Pub. No.: WO2019/146093
PCT Pub. Date: Aug. 1, 2019

(65) Prior Publication Data
US 2020/0344928 A1    Oct. 29, 2020

(51) Int. Cl.
*H05K 13/08*   (2006.01)
*B65G 47/90*   (2006.01)
(Continued)

(52) U.S. Cl.
CPC ........... *H05K 13/086* (2018.08); *B65G 47/90* (2013.01); *H05K 13/0084* (2013.01);
(Continued)

(58) Field of Classification Search
CPC .. H05K 13/0084; H05K 13/02; H05K 13/021; H05K 13/043; H05K 13/0434;
(Continued)

(56) References Cited

U.S. PATENT DOCUMENTS 6,036,425 A * 3/2000 Seto ................... H05K 13/0434
414/280
6,647,616 B1    11/2003 Matsumura et al.

FOREIGN PATENT DOCUMENTS

JP    11-71027 A    3/1999
JP    11-278671 A    10/1999
(Continued)

OTHER PUBLICATIONS

International Search Report dated Apr. 10, 2018 in PCT/JP2018/002639 filed Jan. 29, 2018, 1 page.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A tray-type component supply device includes an exchanging table configured to lift and lowered between an upper position and a lower position, a conveyance section configured to receive a tray from the exchanging table and convey the tray, and a control section configured to receive a detection signal from the detection sensor and cause the driving section to operate the exchanging table, the control section including an abnormality detecting section configured to detect an abnormal state in which a height position of the exchanging table becomes unidentified, a retraction operating section configured to cause the exchanging table to move to the retraction position at a low speed when the abnormal state is detected, and a calibration and restoration section configured to calibrate the height position of the exchanging table to restore a normal state.

7 Claims, 6 Drawing Sheets

(51) Int. Cl.
  *H05K 13/00*   (2006.01)
  *H05K 13/02*   (2006.01)
  *H05K 13/04*   (2006.01)

(52) U.S. Cl.
  CPC ......... *H05K 13/021* (2013.01); *H05K 13/043* (2013.01); *H05K 13/089* (2018.08); *Y10T 29/53174* (2015.01)

(58) Field of Classification Search
  CPC ................ H05K 13/086; H05K 13/089; Y10T 29/4913; Y10T 29/53174; B65G 43/02; B65G 47/90; B65G 59/063
  See application file for complete search history.

(56) References Cited

FOREIGN PATENT DOCUMENTS

| | | |
|---|---|---|
| JP | 2001-291993 A | 10/2001 |
| JP | 2010-267651 A | 11/2010 |

\* cited by examiner

TRAY-TYPE COMPONENT SUPPLY DEVICE

TECHNICAL FIELD

The present description relates to a tray-type component supply device for supplying components by use of trays.

BACKGROUND ART

A board work machine for producing a board on which multiple components are mounted includes a solder printing machine, a component mounter, a reflow machine, a board inspection machine, and the like. It is general practice to make up a board production line by providing these board work machines in a row. In them, the component mounter may include a tray-type component supply device using a tray on which components are arranged from time to time. In such a tray-type component supply device, generally, multiple trays are held, and when components are consumed, multiple components can be supplied by exchanging trays. Normally, one of a tray holding section, which is configured to hold multiple trays, and an exchanging table, which is configured to play a role of exchanging trays, performs the lifting and lowering operation, Patent Literature 1 discloses a technical example of a tray-type component supply device of this type.

An embodiment of Patent Literature 1 discloses an electronic component supply device including a lifting and lowering section for lifting and lowering multiple pallets each having a tray rested thereon while holding them and a feeder section for pulling out the pallets from the lifting and lowering section. Then, when power is supplied to the electronic component supply device, the lifting and lowering section and the feeder section perform their origin operations (encoder's origin confirming operations). As this occurs, a sensor is made to detect whether a pallet and the feeder section are in an interference position where the pallet and the feeder section may possibly come into interference with each other, and if any possibility of interference, the order in which the origin operations are performed is changed so as to avoid the possible interference.

PATENT LITERATURE

Patent Literature 1: JP-A-2001-291993

BRIEF SUMMARY

Technical Problem

Incidentally, the configuration of the tray-type component supply device is not limited to the technique disclosed in Patent Literature 1, and there may occur a situation in which a control section, configured to control the lifting and lowering section of the tray-type component supply device, falls in an abnormal state in which the height position of the lifting and lowering section becomes unknown or unidentified. In this abnormal state, in the event that the control section continues the normal control, the lifting and lowering section might be lifted or lowered beyond a predetermined upper position or a predetermined lower position. As a result, there may occur a risk of the lifting and lowering section being brought into collision with a rising upper end or a lowering lower end or a tray being imparted an impact.

In the present description, a problem to be solved is to provide a tray-type component supply device in which a normal state can automatically be restored with safety ensured even in the event that an abnormal state occurs in which a height position of an exchanging table, which plays a role of exchanging trays, becomes unknown or unidentified.

Solution to Problem

According to the present description, there is provided a tray-type component supply device including: an exchanging table configured to lift and lowered between an upper position and a lower position with resting a tray on which a component is arranged, and deliver the tray in a delivery position; a conveyance section configured to receive the tray from the exchanging table in the delivery position and convey the tray to a predetermined supply position; a driving section configured to drive the exchanging table to lift and lowered; at least one of an upper detection sensor configured to detect the exchanging table in the upper position constituting a retraction position and a lower detection sensor configured to detect the exchanging table in the lower position constituting a retraction position; and a control section configured to obtain a detection signal from at least one of the upper detection sensor and the lower detection sensor and cause the driving section to bring the exchanging table into operation, wherein the control section further comprising: an abnormality detecting section configured to detect an abnormal state in which a height position of the exchanging table becomes unidentified; a retraction operating section configured to cause the exchanging table to move to the retraction position in a low speed, being slower than a lifting and lowering speed in a normal state, when the abnormal state is detected; and a calibration and restoration section configured to calibrate the exchanging table for the height position and restore the height position to a normal state.

Advantageous Effects

In the tray-type component supply device disclosed in the present description, the exchanging table is caused to move to the retraction position at the low speed when the abnormal state occurs in which the height position of the exchanging table is unidentified. In this case, the driving section is stopped after the sensor detects that the exchanging table has moved to the retraction position. Nevertheless, because of the low speed, the exchanging table is prevented from overrunning the retraction position, and, even in the event that the exchanging table overruns the retraction position, it should be extremely small. Therefore, safety is ensured in the operation of the exchanging table. Further, since the height position can be calibrated at the height position where the safety is ensured, the tray-type component supply device can automatically be restored to the normal state.

DESCRIPTION OF EMBODIMENTS

1. Overall Configuration of Component Mounter 1

Figure 1:
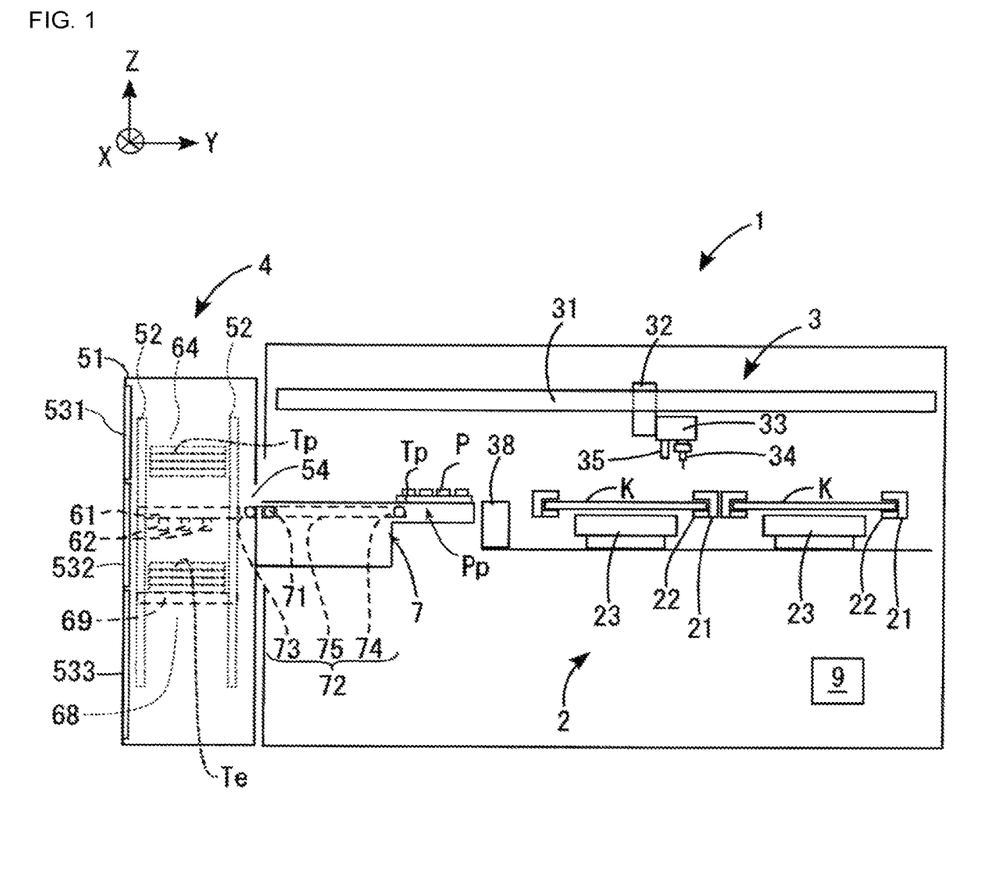
FIG. 1 is a side view schematically showing an overall configuration of a component mounter on which a tray-type component supply device is fitted.

Referring to FIGS. 1 to 9, a tray-type component supply device 4 of a first embodiment will be described. FIG. 1 is a side view showing schematically an overall configuration of component mounter 1 on which tray-type component supply device 4 is fitted. Component mounter 1 includes board conveyance device 2, component transfer device 3, part camera 38, and host control device 9, in addition to tray-type component supply device 4. In FIG. 1, a left-right direction denotes a Y-axis direction in which tray TP and empty tray Te are conveyed, and a direction from a front surface to a rear surface or vice versa of a sheet of paper on which FIG. 1 is drawn denotes an X-axis direction which intersects the Y-axis direction at right angles within a horizontal plane. Firstly, an overall configuration of component mounter 1 will briefly be described.

Board conveyance device 2 has a dual lane-type configuration in which two boards can be conveyed side by side. Board conveyance device 2 conveys boards K into component mounter and positions the boards in a predetermined position, Additionally, board conveyance device 2 conveys boards K, on which mounting work has completely be performed, out from the predetermined position. Lanes of board conveyance device 2 are each made up of pair of guide rails 21, pair of conveyor belts 22, clamping device 23, and the like, Pair of guide rails 21 are disposed parallel to the X-axis direction while being a distance, which is substantially the same as a width of board K, apart from each other. Pair of conveyor belts 22 each move into a circle along guide rails 21 and convey boards K rested thereon, Clamping device 23 is provided between pair of guide rails 21, Clamping device 23 clamps board K in a predetermined position for positioning. Board conveyance device 2 may be of a single-lane type.

Component transfer device 3 picks up component P from supply position Pp of tray-type component supply device 4 and mounts component P so picked up in a mounting position designated on board K, Component transfer device 3 is made up of head driving mechanism 31, moving table 32, mounting head 33, suction nozzle 34, board camera 35, and the like. Head driving mechanism 31 drives moving table 32 in the X-axis direction and the Y-axis direction. Mounting head 33 is provided detachably on moving table 32. Suction nozzle 34 is provided detachably on mounting head 33. Suction nozzle 34 picks up component P through suction by making use of a negative pressure. Board camera 35 is provided on mounting head 33. Board camera 35 images a position reference mark affixed to board K to thereby detect an accurate position of board K.

Part camera 38 is provided between component transfer device 3 and tray-type component supply device 4 while being directed upwards. Part camera 38 images component P picked up by suction nozzle 34 from below. Host control device 9 is configured using a computer system, There is imposed no limitation on an installation position for hose control device 9, Host control device 9 controls board conveyance device 2, component transfer device 3, part camera 38, and tray-type component supply device 4 in making progress in mounting work of component P.

2. Configuration of Tray-Type Component Supply Device 4

Tray-type component supply device 4 is fitted detachably at a front side of component mounter 1. Tray-type component supply device 4 holds multiple trays Tp, on each of which components P are aligned, and supplies components P in supply position Pp. In addition, tray-type component supply device 4 can also hold multiple empty trays Te resulting after components P have been supplied therefrom. Tray-type component supply device 4 is made up of housing 51, exchanging table 61, tray supply mechanism 64, empty tray receiving mechanism 68, conveyance section 7, driving section 81 (shown in FIG. 6), control section 82 (shown in FIG. 6), and the like.

As shown in FIG. 1, housing 51 has a vertically long rectangular parallelepiped shape. Four struts 52 are erected parallel to one another in an interior of housing 51. As will be described later, several members are provided on strut 52. Tray supply mechanism 64 is provided close to an upper portion in an interior space of housing 51. Empty tray receiving mechanism 68 is provided close to a lower portion in the interior of housing 51.

Exchanging table 61 has a rectangular plate-like shape, which is larger one size than tray Tp. Exchanging table 61 is disposed somewhere between tray supply mechanism 64 and empty tray receiving mechanism 68. Exchanging table 61 has a total of six lower claw members 62, three at each of the left and right of a lower side thereof. Lower claw members 62 hold and release empty tray Te, Exchanging table 61 is driven by driving section 81, which will be described later, so as to lift and lowered along four struts 52.

Exchanging table 61 receives tray Tp from tray supply mechanism 64 in an upper position to which exchanging table 61 is lifted and rests it on an upper surface thereof. Exchanging table 61 receives further empty tray Te from conveyance section 7 in the upper position and holds empty tray Te so received with lower claw members 62. The upper position constitutes a receiving position where exchanging table 61 receives tray Tp and empty tray Te. In addition, exchanging table 61 delivers tray Tp to conveyance section 7 in a lower position to which exchanging table 61 is lowered. Exchanging table 61 further delivers empty tray Te to empty tray receiving mechanism 68 in the lower position. The lower position constitutes a delivery position where exchanging table 61 delivers tray Tp and empty tray Te.

A reference position indicating a reference referred to in order to determine a height position of exchanging table 61 is set somewhere between the upper position and the lower position. The reference position is set with a view to improving the working efficiency of assembling work and adjusting work, as well as improving the assembling accuracy and the adjusting accuracy. As will be described later, the height position of exchanging table 61 is calibrated in the reference position and the lower position and is not calibrated in the upper position.

Upper door 531, middle door 532, and lower door 533 are provided on a front side of casing 51 sequentially from an upper end to a lower end thereof. Upper door 531 is opened when tray supply mechanism 64 is replenished with tray Tp. Middle door 532 is opened when tray Tp rested on exchanging table 61 or empty tray Te held by exchanging table 61 is checked for their states. Lower door 533 is opened when empty tray Te is removed from empty tray receiving mechanism 68, Tray departure and entry port 54 is opened in a rear side of housing 51 at a middle height thereof.

Conveyance section 7 is provided in such a manner as to face tray departure and entry port 54. Conveyance section 7 has pivoting mechanism 71 and conveyance mechanism 72. Conveyance mechanism 72 includes first roller 73 disposed on a side facing housing 51, second roller 74 disposed on a side facing supply position Pp, conveyor belt 75 extended to move in a circle between the two rollers, and the like, Pivoting mechanism 71 delivers tray Tp rested on exchanging table 61 to conveyance mechanism 72 by way of tray departure and entry port 54. Conveyance mechanism 72 conveys tray Tp to supply position Pp. When tray Tp is conveyed to supply position Pp, where component P on tray Tp is picked up, tray Tp becomes empty, resulting in empty tray Te, conveyance mechanism 72 conveys empty tray Te back to pivoting mechanism 71. Then, pivoting mechanism 71 delivers empty tray Te to lower claw members 62 of exchanging table 61 by way of tray departure and entry port 54.

Figure 2:
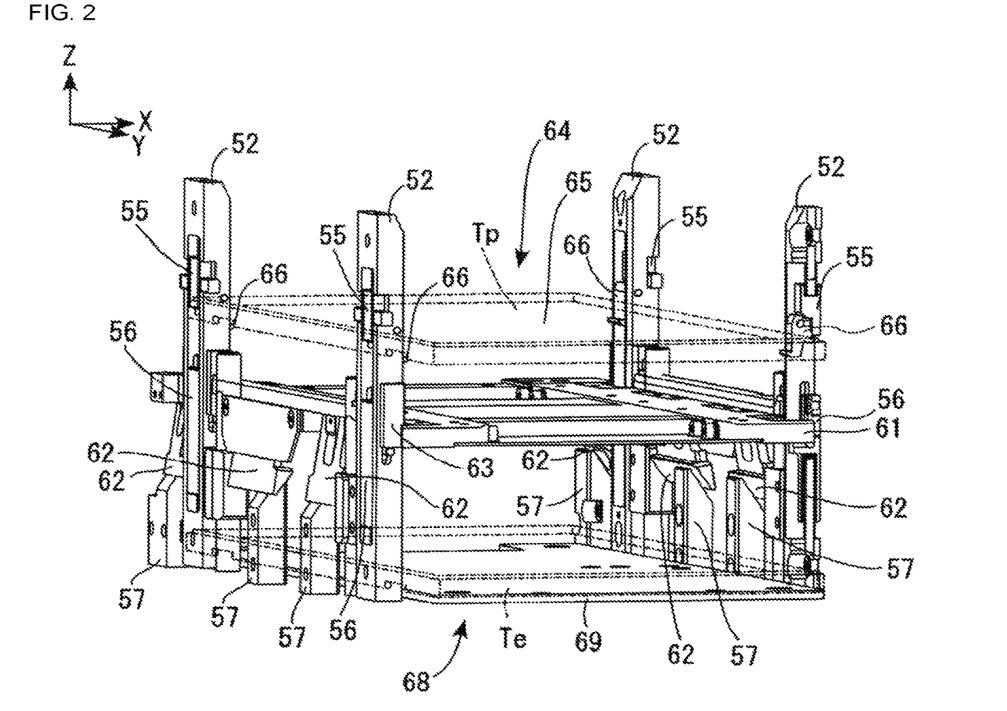
FIG. 2 is a perspective view showing a main configuration of an interior of a casing of the tray-type component supply device.
Figure 3:
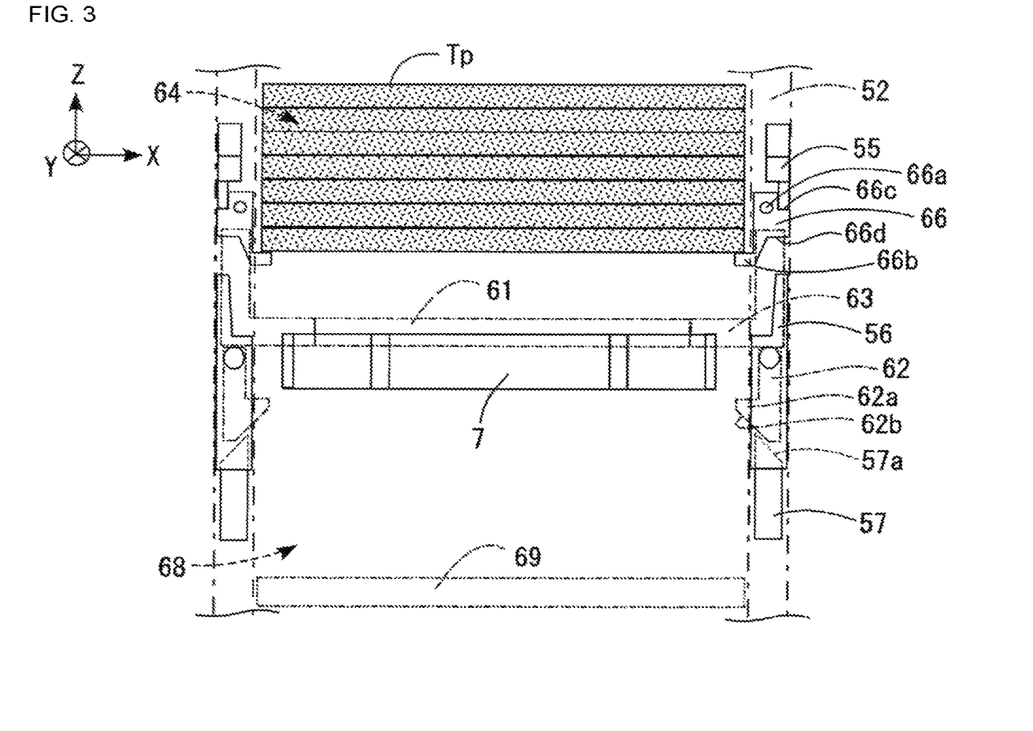
FIG. 3 is a front view showing a configuration of the tray-type component supply device with an exchanging table staying in a reference position.
Figure 4:
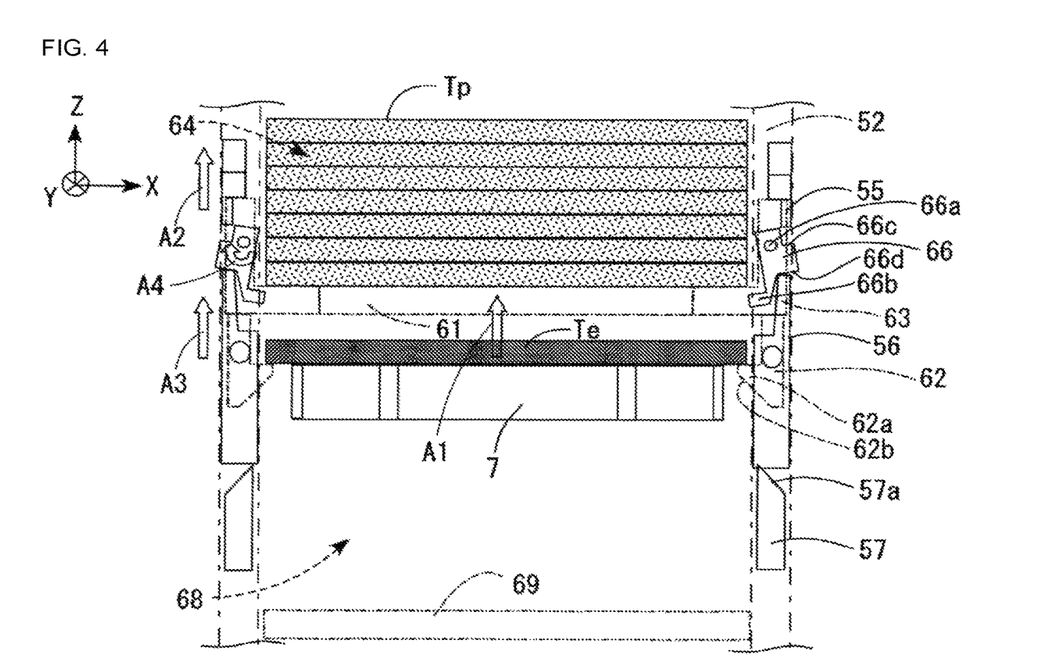
FIG. 4 is a front view illustrating the configuration and an operation of the tray-type component supply device with the exchanging table staying in an upper position.
Figure 5:
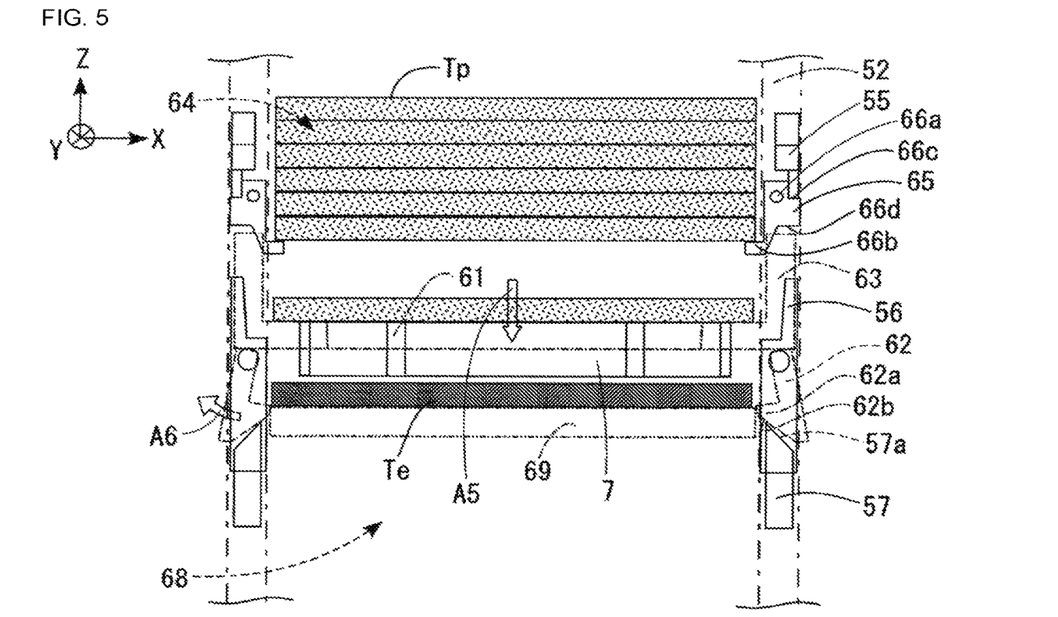
FIG. 5 is a front view illustrating the configuration and an operation of the tray-type component supply device with the exchanging table staying in a lower position.

FIG. 2 is a perspective view showing a main configuration in an interior of housing 51 of tray-type component supply device 4. In FIG. 2, one tray Tp and one empty tray Te are indicated by broken lines. FIG. 3 is a front view showing a configuration of tray-type component supply device 4 with exchanging table 61 staying a reference position. FIG. 4 is a front view illustrating the configuration and an operation of tray-type component supply device 4 with exchanging table 61 staying an upper position. FIG. 5 is a front view illustrating the configuration and an operation of tray-type component supply device 4 with exchanging table 61 staying in a lower position.

Figure 6:
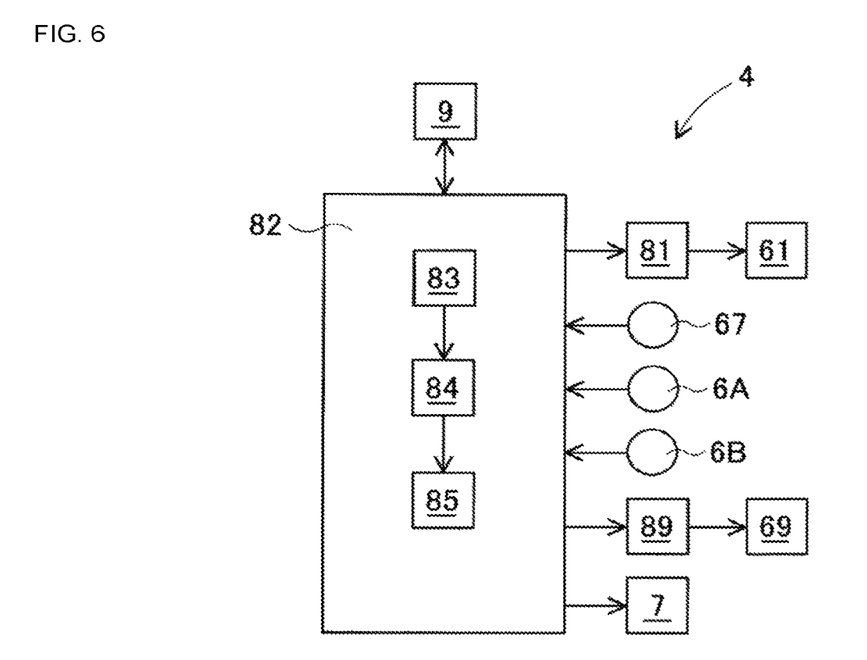
FIG. 6 is a block diagram showing a configuration of the tray-type component supply device in relation to the drive and control thereof.

In FIGS. 3 to 5, exchanging table 61 and empty tray holding section 69 are indicated by alternate long and short dash lines. In addition, tray Tp is indicated by a dot pattern, and empty tray Te is indicated by a shaded pattern, FIG. 6 is a block diagram showing configurations for drive and control of tray-type component supply device 4.

Tray supply mechanism 64 is made up of tray holding section 65, upper claw members 66, upper claw sensors 67, and the like. Tray holding section 65 corresponds to a space inwards of four struts 52 in the interior space of casing 51. Multiple trays Tp are stacked up in this space and are held by upper claw members 66. Upper claw members 66 are provided individually on struts 52, As shown in FIGS. 3 to 5, upper claw member 66 includes support portion 66a portion 66a, claw portion 66b, restricting plane 66c, and drive plane 66d.

Support portion 66a is rotatably supported on strut 52. As a result of this configuration, upper claw member 66 oscillates between a holding posture (refer to FIGS. 3, 5) and a releasing posture (refer to FIG. 4). Claw portion 66b is disposed downwards of support portion 66a. Claw portion 66b takes the form of a hook, which projects inwards. Restricting plane 66c is formed by an upper plane situated outwards of support portion 66a. Drive plane 66d is formed by a lower plane situated downwards of restricting plane 66c.

For oscillation of upper claw member 66, restricting block 55, upper releasing block 63, and drive block 56 are provided. Restricting block 55 is provided on strut 52 in such a manner as to move up and down. Restricting block 55 is biased downwards by a biasing member, not shown, to thereby press restricting plane 66c downwards. As a result, upper claw member 66 is normally maintained in a holding posture. With upper claw member 66 maintained in the holding posture, claw portion 66b is placed underneath a lower edge of tray Tp to thereby hold tray Tp.

Upper releasing block 63 is provided close to an end portion of exchanging table 61, Upper releasing block 63 pushes up restricting block 55 against the biasing effort by the biasing member as a result of the exchanging table 61 being lifted. This releases the holding posture of upper claw member 66. Drive block 56 is provided on strut 52 in such a manner as to move up and down. Drive block 56 pushes up drive plane 66d in association with the lifting operation of exchanging table 61. As a result, upper claw member 66 oscillates from the holding posture to the releasing posture, With upper claw member 66 taking the releasing posture, claw portion 66b is released from the lower edge of tray Tp to thereby release tray Tp.

Upper claw sensor 67 is shown in FIG. 6 and is omitted from illustration in FIGS. 2 to 5. Upper claw sensor 67 detects the posture of upper claw member 66 and sends a detection signal to control section 82. Upper claw sensor 67 can detect a releasing operation of upper claw member 66 in which upper claw member 66 changes its posture from the holding posture to the releasing posture. As upper claw sensor 67, a light cut-off detection sensor can be used which is configured to irradiate detection light towards upper claw member 66 to thereby detect whether light is cut off. Upper claw sensor 67 also serves as an upper detection sensor for detecting the upper position of exchanging table 61.

Empty tray receiving mechanism 68 is made up of lower claw members 62 of exchanging table 61 described above, empty tray holding section 69, lower claw sensors 6A, and the like. Lower claw member 62 includes a support portion, whose reference sign is omitted, claw portion 62a, and drive slope portion 62b. Lower claw member 62 is supported in such a manner as to oscillate by the support portion, so as to oscillate between a holding posture (refer to FIG. 4) and a releasing posture (refer to FIG. 5).

Claw portion 62a is disposed downwards of the support portion and takes the form of a hook, which projects inwards. Drive slope portion 62b is formed downwards of claw portion 62a. Lower claw member 62 is biased inwards by a biasing member, not shown, is normally maintained in a holding posture. With lower claw member 62 taking the holding posture, claw portion 62a is placed underneath a lower edge of empty tray Te to thereby hold empty tray Te.

For oscillation of lower claw member 62, lower releasing block 57 is fixedly provided on strut 52. Lower releasing block 57 has a slope portion 57a corresponding to drive slope portion 62b of lower claw member 62. When exchanging table 61 is lowered, drive slope portion 62b of lower claw member 62 is brought into abutment with slope portion 57a of lower releasing block 57 to thereby be pushed outwards. This causes lower claw member 62 to oscillate from the holding posture to the releasing posture. With lower claw member 62 taking the releasing posture, claw portion 62a is released from the lower edge of empty tray Te to thereby release empty tray Te.

Empty tray holding section 69 takes the form of a rectangular plate whose size is substantially the same as that of exchanging table 61. Empty tray holding section 69 is driven to lift and lowered by empty tray driving section 89. Empty tray holding section 69 starts a lifting operation before lower claw members 62 release empty tray Te and receives empty tray Te. Empty tray holding section 69 can hold multiple empty trays Te stacked one another.

Lower claw sensor 6A is shown in FIG. 6 and is omitted from illustration in FIGS. 2 to 5. Lower claw sensor 6A detects the posture of lower claw member 62 and sends a detection signal to control section 82. Lower claw sensor 6A can detect a releasing operation of lower claw member 62 in which lower claw member 62 changes its posture from the holding posture to the releasing posture. As lower claw sensor 6A, a light cut-off detection sensor can be used as in the case with upper claw sensor 67. Lower claw sensor 6A also serves as a lower detection sensor for detecting exchanging table 61 staying in the lower position.

Further, as shown in FIG. 6, reference detection sensor 6B is provided. Reference detection sensor 6B detects exchanging table 61 in the reference position and sends a detection signal to control section 82. A light cut-off detection sensor can also be used for reference detection sensor 6B.

Next, referring to FIG. 6, configurations for driving and controlling tray-type component supply device 4 will be described. Control section 82 controls driving section 81, empty tray driving section 89, and conveyance section 7, Additionally, control section 82 obtains detection signals of upper claw sensor 67, lower claw sensor 6A, and reference detection sensor 6B. Further, control section 82 is connected with host control device 9 for communication. Control section 82 normally controls a component supply operation according to a command from host control device 9.

A pulse motor, which is configured to operate using a pulse voltage, is used for driving section 81 for driving exchanging table 61, The pulse motor outputs an amount of driving force proportional to the number of pulses of a pulse voltage applied thereto. Therefore, the number of pulses corresponding to a separation distance between the upper position and the lower position becomes a predetermined number of pulses of a constant value. Exchanging table 61 switches its operation between the lifting operation and the lowering operation by switching the polarity of the pulse voltage or inserting a reverse gear into a driving force transmission path. A pulse motor is also used for empty tray driving section 89 for driving empty tray holding section 69; however, a motor of different type may also be used therefor.

For a normal control, control section 82 applies a pulse voltage of a predetermined number of pulses to driving section 81 (the pulse motor) to thereby cause exchanging table 61 to lift by a predetermined distance. After the pulse voltage of the predetermined number of pulses has been applied, control section 82 confirms a detection signal from upper claw sensor 67 or lower claw sensor 6A. By confirming the detection signal in this way, control section 82 confirms that exchanging table 61 stays in the upper position or the lower position. That is, for the normal control, exchanging table 61 reciprocates up and down between the upper position and the lower position and does not stop in the reference position and other halfway positions therebetween. Additionally, control section 82 does not confirm detection signals from the sensors (67, 6A, 6B) one by one at a halfway point in time while exchanging table 61 is rising or lowering.

Control section 82 includes abnormality detecting section 83, retraction operating section 84, and calibration and restoration section 85 as a functional section for monitoring for an abnormal state and restoring the normal state from an abnormal state, if any. Abnormality detecting section 83 detects an abnormal state in which the height position of exchanging table 61 becomes unidentified while exchanging table 61 is rising or lowering or when exchanging table 61 finishes rising or lowering. For example, in the event that exchanging table 61 interferes with a foreign matter while it is rising or lowering, a predetermined operating amount is not maintained, resulting in the height position of exchanging table 61 becoming unidentified. In addition, for example, the height position of exchanging table 61 becomes identified due to the step-out of driving section 81 (the pulse motor).

Specifically speaking, abnormality detecting section 83 determines on an abnormal state when upper claw sensor 67 and lower claw sensor 6A do not detect exchanging table 61 even though the pulse voltage of the predetermined number of pulses is applied to driving section 81 (the pulse motor). The present disclosure is not limited thereto, and hence, other abnormality detection methods may be used. For example, abnormality detecting section 83 may monitor a current flowing to driving section 81 (the pulse motor) for determination of an abnormal state.

When an abnormal state occurs, the operating amount of exchanging table 61 becomes insufficient, whereby exchanging table 61 does not reach the upper position or the lower position. Should the normal control be continued in which the pulse voltage of the predetermined number of pulses is applied in the abnormal state, there is likely to be a possibility that exchanging table 61 continues operating beyond the upper position or the lower position. In other words, safety is not ensured in operation of exchanging table 61.

As a result, retraction operating section 84 causes exchanging table 61 to move to the retraction position at a lower speed slower than a rising speed used in the normal state, when the abnormal state is detected. The low speed is realized as a result of the frequency (occurrence frequency) of the pulse voltage being controlled to be small. The retraction position is a position where the safety is ensured, and the upper position or the lower position is selectively set as the retraction position.

Calibration and restoration section 85 calibrates the height position of exchanging table 61 after exchanging table 61 has operated to the retraction position.

Abnormality detecting section 83, retraction operating section 84, and calibration and restoration section 85 operate autonomously independent of host control device 9. This enables tray-type component supply device 4 to automatically be restored to the normal state. Additionally, host control device 9 neither has to recognize the abnormal state of tray-type component supply device 4 nor has to manage it. Functions of abnormality detecting section 83, retraction operating section 84, and calibration and restoration section 85 will be described in greater detail when describing operations in relation to the abnormal state later.

3. Operations Performed in Normal State

Next, there will be described operations performed by tray-type component supply device 4 in the normal state. As indicated by arrow A1 in FIG. 4, exchanging table 61 moves up to the upper position. At this time, as indicated by arrow A2, restricting blocks 55 are pushed up by upper releasing blocks 63. Further, as indicated by arrow A3, driving blocks 56 are also lifted. As indicated by arrow A4, upper claw members 66 oscillate from the holding posture to the releasing posture. As a result, the whole of multiple trays Tp, which are stacked one another, is released temporarily and are then rested on exchanging table 61.

On the other hand, empty tray Te is delivered from conveyance section 7 to exchanging table 61. Exchanging table 61 holds empty tray Te delivered thereto with lower claw members 62. Thereafter, when exchanging table 61 starts lowering, restricting blocks 55 and driving blocks 56 lower, and upper claw members 66 return to their holding postures.

When returning to the holding postures, upper claw members 66 put in claw portions 66b between lowermost tray Tp and second lowermost tray Tp. This allows lowermost tray Tp to be delivered to exchanging table 61. Lowermost tray Tp is held by upper claw members 66 again. Thereafter, exchanging table 61 continues lowering. In addition, empty tray holding section 69 is lifted in advance to a height at which empty tray holding section 69 receives empty tray Te.

As indicated by arrow A5 in FIG. 5, exchanging table 61 lowers to the lower position. At this time, lower claw member 62 come into abutment with corresponding lower releasing blocks 57 and then oscillate from their holding postures to the releasing postures as indicated by arrow A6. As a result, empty tray Te is released and is then delivered to empty tray holding section 69, being rested on an upper surface thereof. On the other hand, tray Tp, which is rested on exchanging table 61, is delivered to conveyance section 7. This ends one cycle of tray supply operations. Thereafter, this cycle is repeated.

4. Operations, Functions, and Working Effects for Abnormal State

Figure 7:
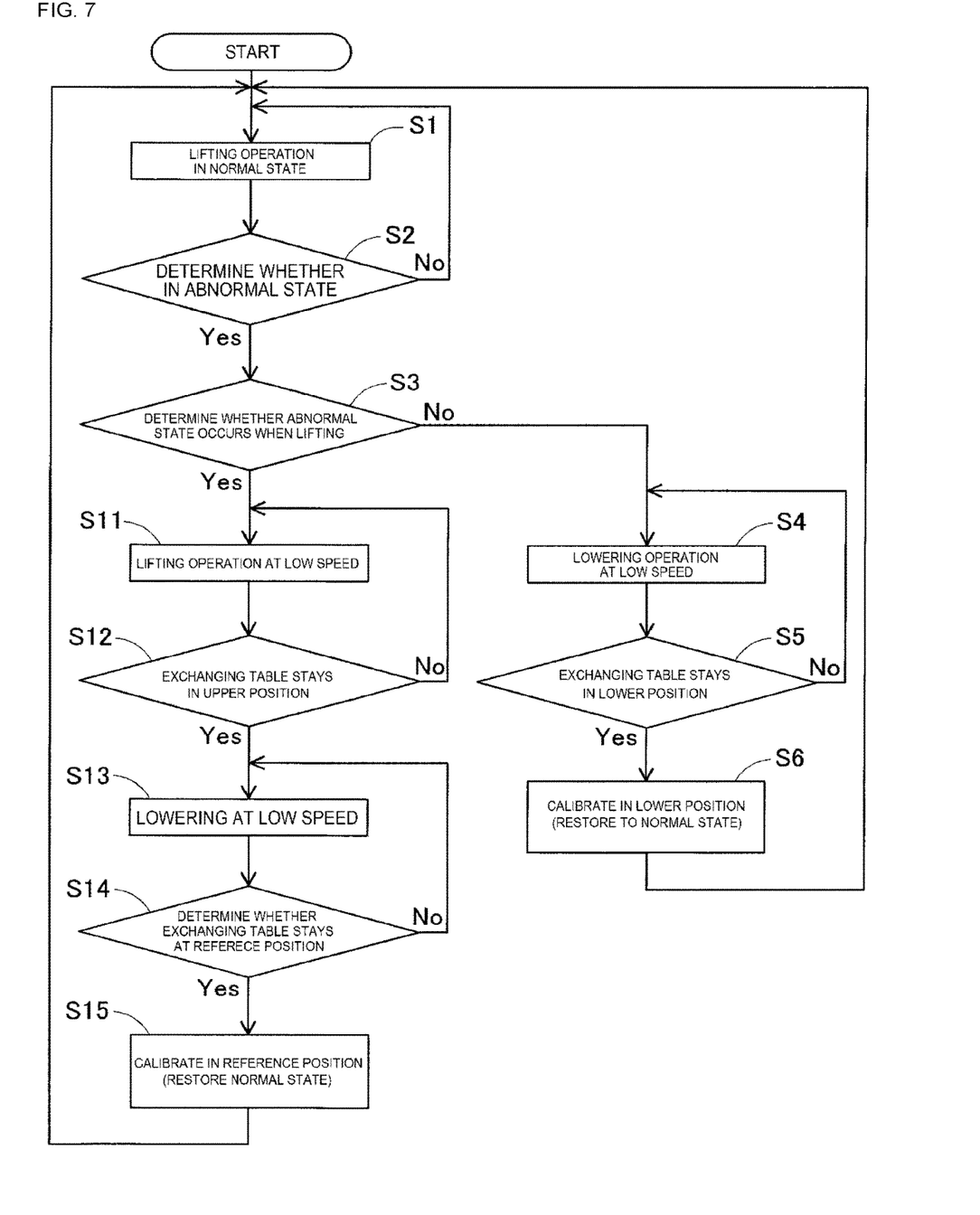
FIG. 7 is an operation flowchart showing controlling operations of a control section for an abnormal state.

Next, operations, functions, and working effects of tray-type component supply device 4 for the abnormal state will be described mainly on rising and lowering operations of exchanging table 61. FIG. 7 is a flowchart of operations showing controlling operations performed by control section 82 for the abnormal state. In step S1 in FIG. 7, control section 82 controls the rising and lowering operations of exchanging table 61 when in the normal state. When exchanging table 61 ends a lifting operation or a lowering operation, the execution of the operation flow proceeds to step S2.

In step S2, abnormality detecting section 83 determines whether the abnormal state is occurring on exchanging table 61. If abnormality detecting section 83 determines that the abnormal state is occurring, the execution of the operation flow proceeds to step 3, whereas abnormality detecting section 83 detects that exchanging table 61 is in the normal state, the execution of the operation flow returns to step S1, In many cases, the normal state is maintained, and hence, an operation loop of step 1 and step 2 is executed repeatedly.

In step S3 to which the operation flow proceeds when the abnormal state is occurring, abnormality detecting section 83 determines whether the abnormal state so detected is an abnormal state occurring while exchanging table 61 is rising or an abnormal state occurring while exchanging table 61 is lowering. The execution of the operation flow is branched in step S3 as follows: if abnormality detecting section 83 determines that the abnormal state so detected is occurring while exchanging table 61 is rising, the execution of operation flow proceeds to step S11, whereas abnormality detecting section 83 determines that the abnormal state so detected is occurring while exchanging table 61 is lowering, the execution of the operation flow proceeds to step S4.

Figure 8:
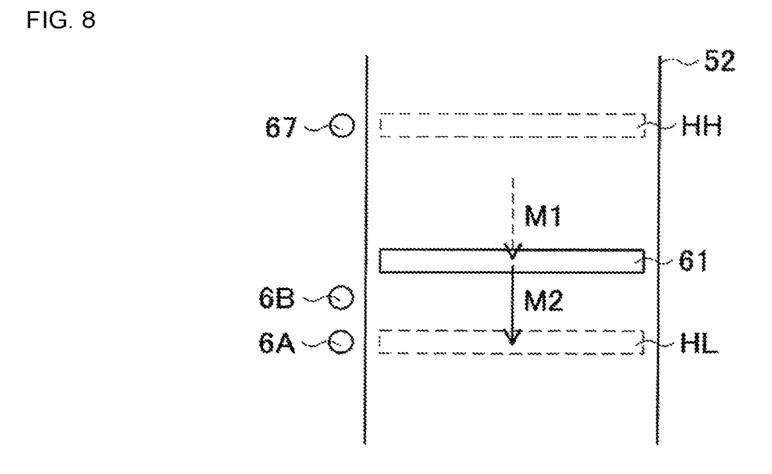
FIG. 8 is a diagram illustrating conceptually an operation performed for an abnormal state occurring when the exchanging table is lowering.

FIG. 8 is a diagram illustrating conceptually an operation for the abnormal state occurring while exchanging table 61 is lowering. As indicated by broken-line arrow M1 in FIG. 8, exchanging table 61 falls in the abnormal state while it is lowering as a result of the height position thereof becoming unidentified. In this case, lower position HL is set as a retraction position where the safety is ensured. In step S4, retraction operating section 84 causes exchanging table 61 to lower at a low speed as indicated by arrow M2.

In subsequent step S5, retraction operating section 84 obtains detection signals from lower claw sensors 6A and determines whether exchanging table 61 stays in lower position HL. If no, the execution of the operation flow returns to step S4. An operation loop of step S4 and step S5 continues until exchanging table 61 lowers to lower position HL. In other words, retraction operating section 84 confirms detection signals from lower claw sensors 6A every moment during the lowering operation of exchanging table 61.

Using the low speed and confirming the detection signals every moment differ from the control performed for the normal state. According to this control, even though the current height position of exchanging table 61 is unidentified, no overrun beyond lower position HL occurs, and even if an overrun beyond lower position HI occurs, it will be extremely small. Should a lowering speed for use in the normal state be used in place of the low speed, even though driving section 81 (the pulse motor) is stopped based on the detection signals from lower claw sensors 6A, exchanging table 61 continues lowering by virtue of inertia. For this reason, exchanging table 61 overruns excessively, thereby no safety being ensured.

When exchanging table 61 lowers to lower position HL, the execution of the operation flow proceeds to step S6. In step S6, calibration and restoration section 85 calibrates the height position of exchanging table 61 in lower position HL. At this time, since the lowering operation of exchanging table 61 indicated by arrow M2 is carried out at the low speed, exchanging table 61 in lower position HL has a high positional accuracy. Consequently, the calibration accuracy of the height position becomes good. Tray-type component supply device 4 is restored to the normal state as a result of the calibration being carried out as described above. Thereafter, the execution of the operation flow is returned to step S1, where the operations for the normal state are automatically resumed.

Figure 9:
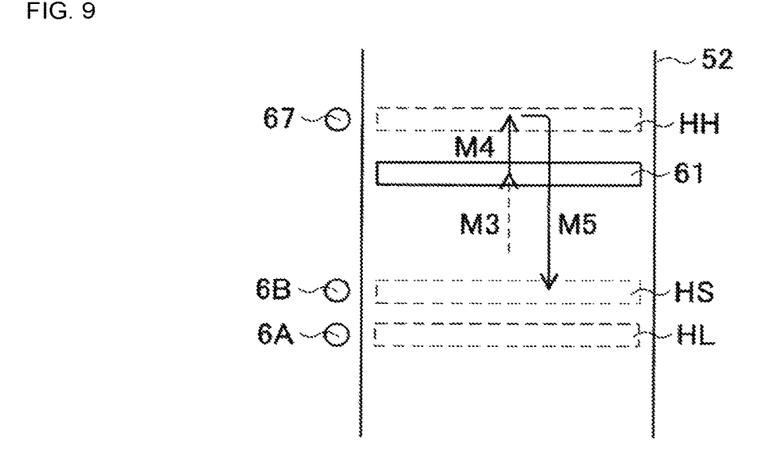
FIG. 9 is a diagram illustrating conceptually an operation performed for an abnormal state when the exchanging table is being lifted.

FIG. 9 is a diagram illustrating conceptually an operation for the abnormal state occurring when exchanging table 61 is rising. As indicated by broken-line arrow M3 in FIG. 9, exchanging table 61 falls in the abnormal state as a result of the height position thereof becoming unidentified while exchanging table 61 is rising. In this case, upper position HH is set as a retraction position where the safety is ensured. In step S11, retraction operating section 84 lifts exchanging table 61 using the low speed as indicated by arrow M4.

In subsequent step S12, retraction operating section 84 obtains detection signals from upper claw sensors 67 and then determines whether exchanging table 61 stays in upper position HH. If no, the execution of the operation flow is returned to step S11. An operation loop of step S11 and step S12 continues until exchanging table 61 is lifted to upper position HH. In other words, retraction operating section 84 confirms detection signals from upper claw sensors 67 every moment while exchanging table 61 is rising.

Using the low speed and confirming the detection signals every moment differ from the control performed for the normal state. According to this control, even if the current height position of the exchange table 61 is unidentified, there is no overrun beyond upper position HH, and should exchanging table 61 overrun beyond upper position HH, it will be extremely small.

When exchanging table 61 is lifted to upper position HH, the execution of the operation flow proceeds to step S13. In step S13, calibration and restoration section 85 causes exchanging table 61 to lower by use of the low speed as indicated by arrow M5. In subsequent step S14, calibration and restoration section 85 obtains detection signals from reference detection sensors 6B and then determines whether exchanging table 61 stays in reference position HS. If no, the execution of the operation flow is returned to step S13. An operation loop of step S13 and step S14 continue until exchanging table 61 lowers to reference position HS.

When exchanging table 61 lowers to reference position HS, the execution of the operation flow proceeds to step S15. In step S15, calibration and restoration section 85 calibrates the height position of exchanging table 61 in reference position HS. Tray-type component supply device 4 is restored to the normal state as a result of the calibration being carried out as described above. Thereafter, the execution of the operation flow is returned to step S1, where the operations for the normal state are automatically resumed.

In the abnormal state occurring during the lifting operation shown in FIG. 9, calibration and restoration section 85 does not calibrate the height position of exchanging table 61 in upper position HH. The reason is that since a total load of multiple trays Tp stacked one another is applied to exchanging table 61 staying in upper position HH, there is a concern that the calibration accuracy is deteriorated. Additionally, since exchanging table 61 lowers at the low speed as indicated by arrow M5, exchanging table 61 staying in reference position HS has a high positional accuracy. Consequently, the calibration accuracy of the height position becomes good.

There can also occur a case in which an abnormal state that cannot be restored to the normal state, in other words, a device failure that cannot be restored is generated. In this case, control section 82 notifies host control device 9 that a device failure has occurred.

In tray-type component supply device 4 according to the first embodiment, exchanging table 61 is caused to move to the retraction position at the low speed when the abnormal state occurs in which the height position of exchanging table 61 becomes unidentified. In this case, driving section 81 is stopped after the arrival of exchanging table 61 at the retraction position is detected by the sensors. Nevertheless, exchanging table 61 does not overrun due to being moved at the low speed, and should exchanging table 61 overrun, it will be extremely small. Therefore, safety is ensured during the operation of exchange table 61. Further, since the height position can be calibrated in the height position where the safety is ensured, tray-type component supply device 4 can automatically be restored to the normal state.

5. Tray-Type Component Supply Device According to Second Embodiment

Figure 10:
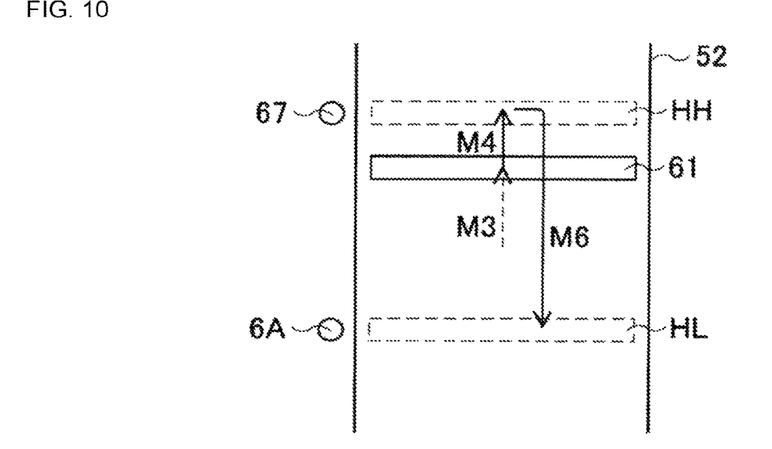
FIG. 10 is a diagram illustrating conceptually an operation performed for an abnormal state when an exchanging table is being lifted in a second embodiment.

Next, a tray-type component supply device according to a second embodiment will be described mainly on features that differ from those of the first embodiment. In the second embodiment, reference position HS is not set, and reference detection sensors 6B are omitted. Due to this, in the second embodiment, operations for an abnormal state that occurs while exchanging table 61 is rising are deformed from the first embodiment. FIG. 10 is a diagram conceptually illustrating an operation of exchange table 61 performed when an abnormal state occurs while exchanging table 61 is rising in the second embodiment.

An operation indicated by broken-line arrows M3 and M4 in FIG. 10 is the same as that of the first embodiment. When exchanging table 61 is lifted to upper position HH, calibration and restoration section 85 causes exchanging table 61 to lower to a lower position at a low speed as indicated by arrow M6. Next, calibration and restoration section 85 calibrates a height position of exchanging table 61 in lower position HL. In this way, the height position where calibration is carried out is changed.

In the second embodiment, the cost can be reduced more than in the first embodiment by omitting reference detection sensors 6B. Since other working effects of the second embodiment are similar to those of the first embodiment, the description thereof will be omitted.

6, Applications and Deformations of Embodiments

In the first and second embodiment, driving section 81 other than the pulse motor and height detection sensors other than upper claw sensors 67 and lower claw sensors 6A can be used. In addition, only lower claw sensors 6A can be used by omitting upper claw sensors 67 and reference detection sensors 6B. In this form, the retraction position is set at lower position HL at all times, and the height position of exchanging table 61 is calibrated in lower position HL at all times. The present disclosure can adopt other various applications and modifications.

REFERENCE SIGNS LIST

1: Component mounter, 4: Tray-type component supply device, 51: Housing, 61: Exchanging table, 62: Lower claw member, 64: Tray supply mechanism, 65: Tray holding section, 66: Upper claw member, 67: Upper claw sensor, 68: Empty tray receiving mechanism, 69: Empty tray holding section, 6A: Lower claw sensor, 6B: reference detection sensor, 7: Conveyance section, 81: Driving section, 82: Control section, 83: Abnormality detecting section, 84: Retraction operating section, 85: Calibration and restoration section, 9: Upper control device, Tp: Tray, Te: Empty tray, P: Component, Pp: Supply position, HH: Upper position, HL: Lower position, HS: Reference position

The invention claimed is:

1. A tray-type component supply device comprising:
an exchanging table configured to lift and lower between an upper position and a lower position with a tray on which a component is arranged, and deliver the tray in a delivery position;
a conveyor configured to receive the tray from the exchanging table in the delivery position and convey the tray to a predetermined supply position;
a driving section configured to drive the exchanging table to lift and lower;
at least one of an upper detection sensor configured to detect the exchanging table in the upper position and a lower detection sensor configured to detect the exchanging table in the lower position; and
a control section configured to obtain a detection signal from at least one of the upper detection sensor and the lower detection sensor and cause the driving section to bring the exchanging table into operation, wherein the control section further comprises:
an abnormality detecting section, wherein during operation of the tray-type component supply device, the abnormality detecting section is configured to detect an abnormal state in which a height position of the exchanging table becomes unidentified;
a retraction operating section, wherein when the abnormality detecting section detects the abnormal state, the retraction operating section is configured to cause the exchanging table to move to one of the upper position and the lower position at a low speed, being slower than a lifting and lowering speed in a normal state when the height position of the exchanging table is identified; and a calibration and restoration section, wherein when the exchanging table reaches the upper position or the lower position at the low speed caused by the retraction operating section, the calibration and restoration section is configured to calibrate the exchanging table for the height position and restore the height position to the normal state.

2. The tray-type component supply device according to claim 1, wherein the tray-type component supply device includes a tray supply mechanism which is comprised of:
- a tray holding section configured to hold the multiple trays in a stacked manner;
- an upper claw member configured to release a lowermost tray from the trays stacked by the tray holding section by lifting the exchanging table; and
- an upper claw sensor detecting a releasing operation of the upper claw member, the upper claw sensor also serving as the upper detection sensor.

3. The tray-type component supply device according to claim 1, wherein the tray-type component supply device includes the upper detection sensor and the lower detection sensor, and when the abnormality detecting section detects the abnormal state during a lifting operation of the exchanging table or at the end of the lifting operation;
the retraction operating section causes the exchanging table to lift to the upper position at the low speed, and the calibration and restoration section performs the calibration in the lower position after lowering the exchanging table to the lower position at the low speed.

4. The tray-type component supply device according to claim 1, wherein the tray-type component supply device includes the upper detection sensor and a reference detection sensor configured to detect the exchanging table staying in a reference position set between the upper position and the lower position, and when the abnormality detecting section detects the abnormal state during a lifting operation of the exchanging table or at the end of the lifting operation,
the retraction operating section causes the exchanging table to lift to the upper position at the low speed, and the calibration and restoration section performs the calibration in the reference position after lowering the exchanging table to the reference position at the low speed.

5. The tray-type component supply device according to claim 1,
wherein the driving section is a pulse motor operating on a pulse voltage, wherein the control section applies the pulse voltage of a predetermined number of pulses, corresponding to a separation distance between the upper position and the lower position, to the pulse motor to thereby cause the exchanging table to lift or lower by the separation distance, and
wherein the abnormality detecting section determines on the abnormal state when at least one of the upper detection sensor and the lower detection sensor does not detect the exchanging table even though the pulse voltage of the predetermined number of pulses is applied to the pulse motor.

6. The tray-type component supply device according to claim 1, wherein the tray-type component supply device includes an empty tray receiving mechanism which is comprised of:
- a lower claw member provided on the exchanging table and configured to receive from the conveyor, hold, and release an empty tray, which is the tray resulting after the component is supplied therefrom;
- an empty tray holding section configured to receive and hold the empty tray that the lower claw section releases by lowering the exchanging table; and
- a lower claw sensor detecting a releasing operation of the lower claw member, the lower claw sensor also serving as the lower detection sensor.

7. The tray-type component supply device according to claim 1, wherein the abnormality detecting section, the retraction operating section, and the calibration and restoration section operate independently from a host control device of a component mounter on which the tray-type component supply device is equipped.

* * * * *